United States Patent [19]

Caspell

[11] Patent Number: 4,686,489
[45] Date of Patent: Aug. 11, 1987

[54] TRIGGERED VOLTAGE CONTROLLED OSCILLATOR USING FAST RECOVERY GATE

[75] Inventor: George J. Caspell, Hillsboro, Oreg.

[73] Assignee: Tektronix, Inc., Beaverton, Oreg.

[21] Appl. No.: 875,030

[22] Filed: Jun. 16, 1986

[51] Int. Cl.[4] .................. H03K 3/023; H03K 3/03
[52] U.S. Cl. ............................... 331/57; 331/111; 331/153; 331/173; 331/DIG. 3
[58] Field of Search .................. 331/57, 111, 153, 172, 331/173, DIG. 3

[56] References Cited

U.S. PATENT DOCUMENTS 3,517,326  6/1970  Roesch .................................. 331/57
4,458,165  7/1984  Jackson ......................... 331/DIG. 3

Primary Examiner—Siegfried H. Grimm
Attorney, Agent, or Firm—John P. Dellett; George T. Noe

[57] ABSTRACT

A voltage controlled triggered oscillator includes a NAND gate and a set of series connected triggerable delay circuits, the output of the NAND gate being fed back to one of its inputs through the delay circuits. A trigger signal is applied to another input of the NAND gate and to triggering inputs of the delay circuits. When the trigger signal is asserted, each delay circuit produces an output signal of state which tracks the state of its input signal but with a predetermined delay so that the NAND gate output oscillates with a frequency determined by the delay times of the delay circuits and the propagation time of the NAND gate. When the trigger signal is deasserted the NAND gate output is terminated and each delay circuit drives its output signal high regardless of the state of its input signal so that the oscillator may be rapidly retriggered.

10 Claims, 3 Drawing Figures

TRIGGERED VOLTAGE CONTROLLED OSCILLATOR USING FAST RECOVERY GATE

BACKGROUND OF THE INVENTION

The present invention relates in general to triggered voltage controlled oscillators and in particular to a triggered oscillator adapted for rapid retriggering.

A triggered oscillator circuit generates a periodic output signal when triggered by an input trigger signal so that the output signal is phase synchronized to the trigger signal with the start of the first cycle of the oscillator output signal beginning a fixed time after the start of the trigger signal. In a well-known triggered oscillator circuit, the output of a NAND gate is fed back to one input of the NAND gate through a delay circuit and a trigger signal is applied to another input of the NAND gate. While the trigger signal remains low, the output of the NAND gate remains high and the oscillator does not oscillate. When the trigger signal is driven high, the output of the NAND gate oscillates with a frequency determined by the delay of the delay circuit and continues to oscillate as long as the trigger signal remains high. The initial state change of the periodic NAND gate output signal follows the leading edge of the trigger signal only by the relatively short switching time of the NAND gate and therefore the oscillator output signal is substantially phase synchronized to the trigger signal.

In some applications it is necessary to resynchronize the oscillator output signal to the trigger signal relatively often, as for example when the oscillator is utilized to control the timing of waveform sampling in an equivalent time waveform sampling system, wherein a periodic waveform is sampled during successive sampling bursts and each burst is triggered by an event in the waveform. Ideally, a triggered oscillator should be able to resynchronize its output to a trigger signal in the event the trigger signal is deasserted and then reasserted in rapid succession. However, in the above-described triggered oscillator circuit a problem arises if the delay of the delay circuit is long compared to the time between deassertion and reassertion of the trigger signal. If the trigger signal is deasserted while the feedback input to the NAND gate is low and then reasserted before the feedback input goes high, the retrigger action will have no effect on the NAND gate output. Therefore in such a triggered oscillator of the prior art, the retriggering of the oscillator must be delayed after the trigger signal is deasserted by at least the "recovery time" required for the oscillator signal delay circuitry to return to steady state with the feedback signal held high. This recovery time is equal to the sum of the propagation delay of the NAND gate and the delay time of the delay circuit. What is needed and would be useful is a triggered oscillator with faster recovery time.

SUMMARY OF THE INVENTION

According to one aspect of the invention, a triggered oscillator comprises a NAND gate and a triggerable delay circuit. A trigger signal and a feedback signal provide inputs to the NAND gate and the output signal of the NAND gate provides an input signal to the triggerable delay circuit. The triggerable delay circuit produces the feedback signal at its output. The trigger signal is also applied as a triggering input to the triggerable delay circuit. When the trigger signal is true, the state of the feedback signal produced by the triggerable delay circuit tracks the state of the NAND gate output signal but in a delayed fashion such that the output of the NAND gate oscillates with the frequency determined by the delay time of the triggerable delay circuit. When the trigger signal is subsequently driven false, the triggerable delay circuit drives its output signal true and holds it true regardless of the state of the NAND gate output signal. When the feedback signal is driven true, the oscillator may be retriggered.

In the triggered oscillator of the present invention the recovery time of the oscillator (the minimum waiting time needed to stop and retrigger the oscillator) is equal to the greater of the delay time of the delay circuit or the propagation time of the NAND gate, rather than the sum of the two as in the case when a non-triggerable delay circuit is utilized. When the desired output signal frequency is relatively low, the required signal delay may be provided by a series of triggerable delay circuits, each providing a small portion of the total required signal delay and each triggered by the same trigger signal output to the NAND gate. In such case the recovery time of the oscillator is equal to the larger of the longest delay time of one of the delay circuits or the propagation time of the NAND gate.

According to a further aspect of the invention the NAND gate comprises a differential logic gate adapted to receive differential trigger and feedback signals and produce a differential output signal. The triggerable delay circuit includes a differential current tree circuit controlled by the trigger signal and by the NAND gate output signal. When the trigger signal is low, the NAND gate output signal causes the current tree alternately to apply a current source to matching R/C networks. When the trigger signal is false, the current tree applies the current source to only one of the R/C networks regardless of the state of the NAND gate output, thereby rapidly driving the delay circuit to a steady, pre-trigger state wherein the feedback signal is held true. The differential feedback signal provided to the logic gate is obtained by level shifting the voltages across the R/C networks and the delay of the delay circuit is controlled by adjusting the capacitance of the matching R/C networks.

According to a still further aspect of the invention, the capacitance of the R/C networks is provided by the gate-to-drain and gate-to-source capacitances of field effect transistors, the drain and source terminals of each transistor being connected together. Such field effect transistors are connected to the RC networks by digitally controlled switches to permit selection of capacitance ranges to grossly adjust the delay of the delay circuit. The capacitance provided by each field effect transistor is adjusted to finely control the delay of the delay circuit by adjusting the gate-to-drain voltage of the field effect transistor.

It is accordingly an object of the invention to provide an improved triggered oscillator having a short recovery time.

It is another object of the present invention to provide an improved triggerable delay circuit for providing a periodic output signal in delayed response to a periodic input signal when triggered by a trigger signal, and for otherwise producing a steady state output signal.

It is a further object of the present invention to provide an improved triggerable delay circuit wherein the duration of the delay is adjustable.

The subject matter of the present invention is particularly pointed out and distinctly claimed in the concluding portion of this specification. However both the organization and method of operation of the invention, together with further advantages and objects thereof, will best be understood by reference to the following description taken in connection with the accompanying drawing wherein like reference characters refer to like elements.

DETAILED DESCRIPTION

Figure 1:
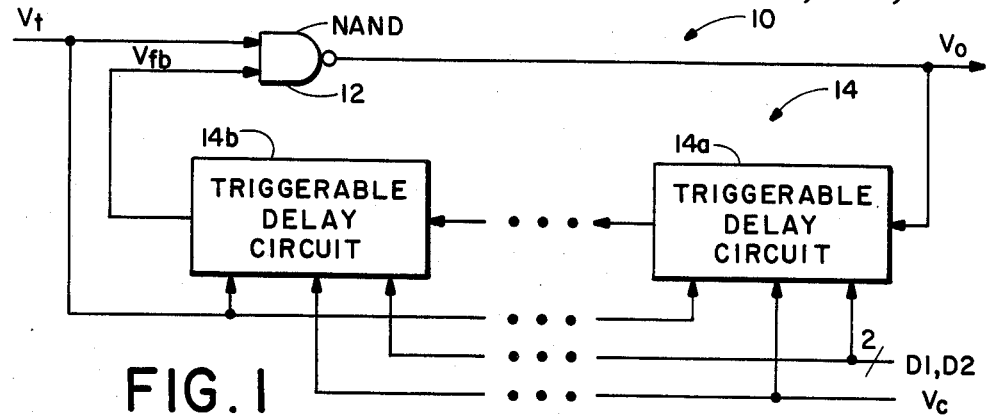
FIG. 1 is block diagram of a triggered, voltage controlled oscillator according to the present invention.

FIG. 1 depicts in block diagram form a triggered, voltage controlled oscillator 10 according to the present invention comprising a NAND gate 12 and a set of one or more triggerable delay circuits 14. NAND gate 12 receives as input signals a trigger signal Vt and a feedback signal Vfb and produces in response thereto an output signal Vo which forms the output signal of the oscillator 10. The trigger signal Vt input to NAND gate 12 is also provided as a triggering input to each triggerable delay circuit 14. The NAND gate output signal Vo is further provided as an input signal to a first triggerable delay circuit 14a of the set of triggerable delay circuits 14 while the output of each triggerable delay circuit 14 is connected to the input of the next delay circuit of the set except for the output of the last delay circuit 14B of the set which provides the feedback signal Vfb applied as input to NAND gate 12.

When the trigger signal Vt is true, the state of the output signal of each triggerable delay circuit 14 tracks the state of its input signal, but the change in state of the output of each delay circuit is delayed by a delay time controlled by a pair of digital control signals D1 and D2 and by the magnitude of a control voltage Vc applied to control inputs of each triggerable delay circuit 14. However, when the trigger signal Vt is driven false, each triggerable delay circuit 14 drives its output signal true regardless of the state of its input signal. Thus initially, when the oscillator 10 is in a quiescent "pretrigger" state, wherein trigger signal Vt is false, the Vo output signal of NAND gate 12 and the Vfb feedback signal output of triggerable delay circuit 14b are both held true. When the trigger signal is subsequently asserted (driven true), NAND gate 12 switches its output signal Vo false and after the combined delay times of delay circuits 14, the feedback signal Vfb input to NAND gate 12 also switches false.

When the feedback signal goes false, NAND gate 12 drives Vo true again, and after the combined delay time of delay circuits 14, Vfb goes true again. When Vfb goes true, NAND gate 12 drives Vo false. This process continues as long as the trigger signal Vt remains true whereby Vo oscillates with a period equal to twice the sum of the delay times of delay circuits 14 and the propagation delay of NAND gate 12. The Vo output signal is phase synchronized to the leading edge of the trigger signal Vt in that the time between the leading edge of the trigger signal and the beginning of the periodic output signal is fixed by the relatively short switching time of the NAND gate 12.

When the trigger signal Vt is deasserted (driven false) the NAND gate 12 drives its Vo output signal true, if not true already, and holds it true regardless of the state of the feedback signal Vfb. At the same time, the deassertion of the trigger signal Vt causes each triggerable delay circuit 14 to return to its quiescent state, driving its output signal true and holding it true until the trigger signal is reasserted. Since deassertion of the feedback signal Vfb directly causes each delay circuit 14 to simultaneously drive its output signal true, the oscillator 10 quickly returns to its quiescent pretrigger state within a time equal to the larger of the propagation time of NAND gate 12 or the longest time required by only one of the delay circuits 14 to return to its quiescent state following trigger signal deassertion. Although the oscillator must return to its quiescent pretrigger state before it can be retriggered, it is not necessary to wait for the effects of the change of state of the trigger signal to propagate through the NAND gate 12 and all of the delay circuits 14 in order for the oscillator 12 to return to its pretrigger quiescent state.

Figure 2:
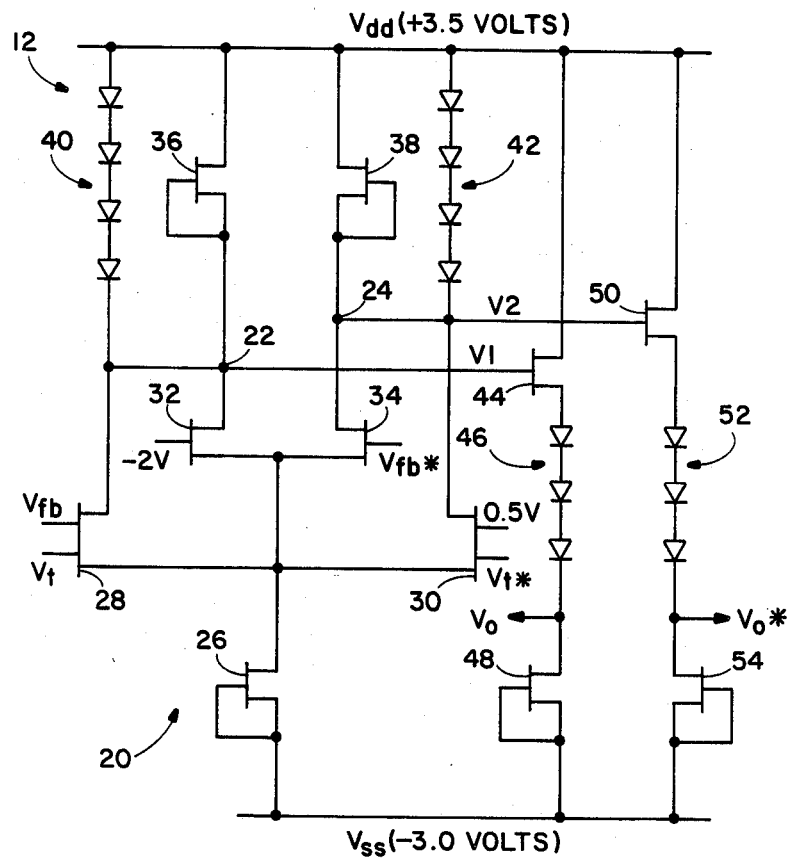
FIG. 2 is a schematic diagram of the NAND gate of FIG. 1.

In the preferred embodiment of the present invention, NAND gate 12 is a differential logic gate and the trigger signal Vt, the oscillator signal Vo, and the feedback signal Vfb are all differential signals. Referring to FIG. 2, NAND gate 12 of FIG. 1, as depicted in schematic diagram form, includes a current tree 20 for selectively connecting a current source to either a circuit node 22 or a circuit node 24, depending on the states of the trigger and feedback input signals to the gate. (In FIG. 2, the complement of the differential trigger signal Vt is indicated by the symbol Vt* while the complement of the differential feedback signal Vfb is indicated by the symbol Vfb*.) Current tree 20 includes a field effect transistor (FET) 26 acting as the current source, a pair of dual gate FETs 28 and 30, and a pair of single gate FETs 32 and 34 for performing the switching operations. The drains of FETs 28 and 32 are attached to circuit node 22 while the drains of FETs 30 and 34 are connected to circuit node 24. The sources of FETs 28, 30, 32 and 34 are all connected to the drain of FET 26, the gate and source of FET 26 being connected to a −3.0 volt source Vss. The trigger signal Vt and the feedback signal Vfb control the gates of FET 28. The trigger signal complement Vt* controls one of the gates of FET 30 while the other gate is connected to a 0.5 volt source. The feedback signal complement Vfb* drives the gate of FET 34 and the gate of FET 32 is connected to a −2 V source.

Circuit node 22 is coupled to a source of positive voltage Vdd (3.5 volts) through a load impedance provided by an FET 36, the gate and source of FET 36 being connected to node 22 and the drain of FET 36 being connected to Vdd. Node 24 is coupled to Vdd through a load impedance provided by another FET 38. A voltage clamp 40 consisting of a series of four diodes is further connected between node 22 and Vdd to limit voltage drop across FET 36 to the sum of four forward bias diode junction voltages, about 2.8 volts. A similar voltage clamp 42 is connected between node 24 and Vdd.

The gate of an FET 44 is also applied to node 22. The drain of FET 44 is connected to Vdd while the source of FET 44 is coupled through a set of three diodes 46 to the drain of another FET 48 having its gate and source tied to Vss. The output signal Vo of gate 12 is taken at the drain of FET 48 acting as a current source to draw current through diodes 46, insuring Vo is level shifted down from the voltage V1 of node 22 by a voltage drop determined by the gate to source drop of FET 44 in combination with the forward drop across diodes 46. An FET 50, a set of three diodes 52, and an FET 54 operate in a fashion similar to FET 44, diodes 46 and FET 48 to shift downward the voltage V2 of node 24 by a similar amount in order to produce the complementary output voltage Vo* at the drain of FET 54.

When the gate 12 is in the quiescent, pretrigger state, the trigger signal is false (i.e., Vt is low and Vt* is high) and the feedback signal is true (i.e., Vfb is high and Vfb* is low). FETs 28, 32 and 34 are off and FET 30 is on. FET 26 draws a constant current through node 24 and FET 30, the current being provided to node 24 by FET 38 and diode clamp 42. The voltage V2 at node 24 is approximately 2.8 volts less than Vdd and the complementary output voltage Vo* is held in a low logic level state, at approximately −1.6 volts. Since FETs 28 and 32 are off, FET 26 draws no current from node 22 and therefore no current is drawn through FET 36 or clamp 40. The voltage V1 at node 22 is equal to Vdd and the gate output signal Vo is at a high logic level state (true), approximately 0.7 volts, or 2.8 volts less than Vdd. Thus when the trigger signal Vt is false, the output signal is true (Vo high, Vo* low) regardless of the state of the feedback signal Vfb.

When gate 12 is triggered by driving Vt true, FET 28 turns on and FET 30 turns off. FET 26 now draws current from node 22 through FET 28, the current being supplied to node 22 through FET 36 and diode clamp 40. V1 is pulled below Vdd and V2 rises to Vdd, thereby driving Vo low and Vo* high. Thus when Vt and Vfb are both true, the output signal Vo is false. Referring to FIG. 1, once Vo is driven false, the delay circuits 14 respond by subsequently driving Vfb false. When Vfb goes false, FET 28 of FIG. 2 turns off and FET 34 turns on, thereby switching the current source FET 26 from node 22 to node 24. This action drives Vo true and Vo* false. When the trigger signal Vt is deasserted FET 30 once again turns on and FET 28 turns off, thereby returning the gate 12 to is quiescent pretrigger state wherein current is drawn from node 24 so as to drive the output signal Vo true regardless of the state of the feedback signal Vfb.

The differential logic gate 12 of FIG. 2 can be thought of as either an AND gate or a NAND gate depending simply on how the output signals Vo and Vo* are labeled. To form an oscillator utilizing gate 12 it is necessary only that the output signal be fed back negatively to the logic gate input through delay circuits, and the necessary signal inversion can be accomplished anywhere in the feedback loop either at the output of the logic gate 12 as shown in FIG. 1 where gate 12 is depicted as a NAND gate, or at the output of any of the delay circuits 14 of FIG. 1.

Figure 3:
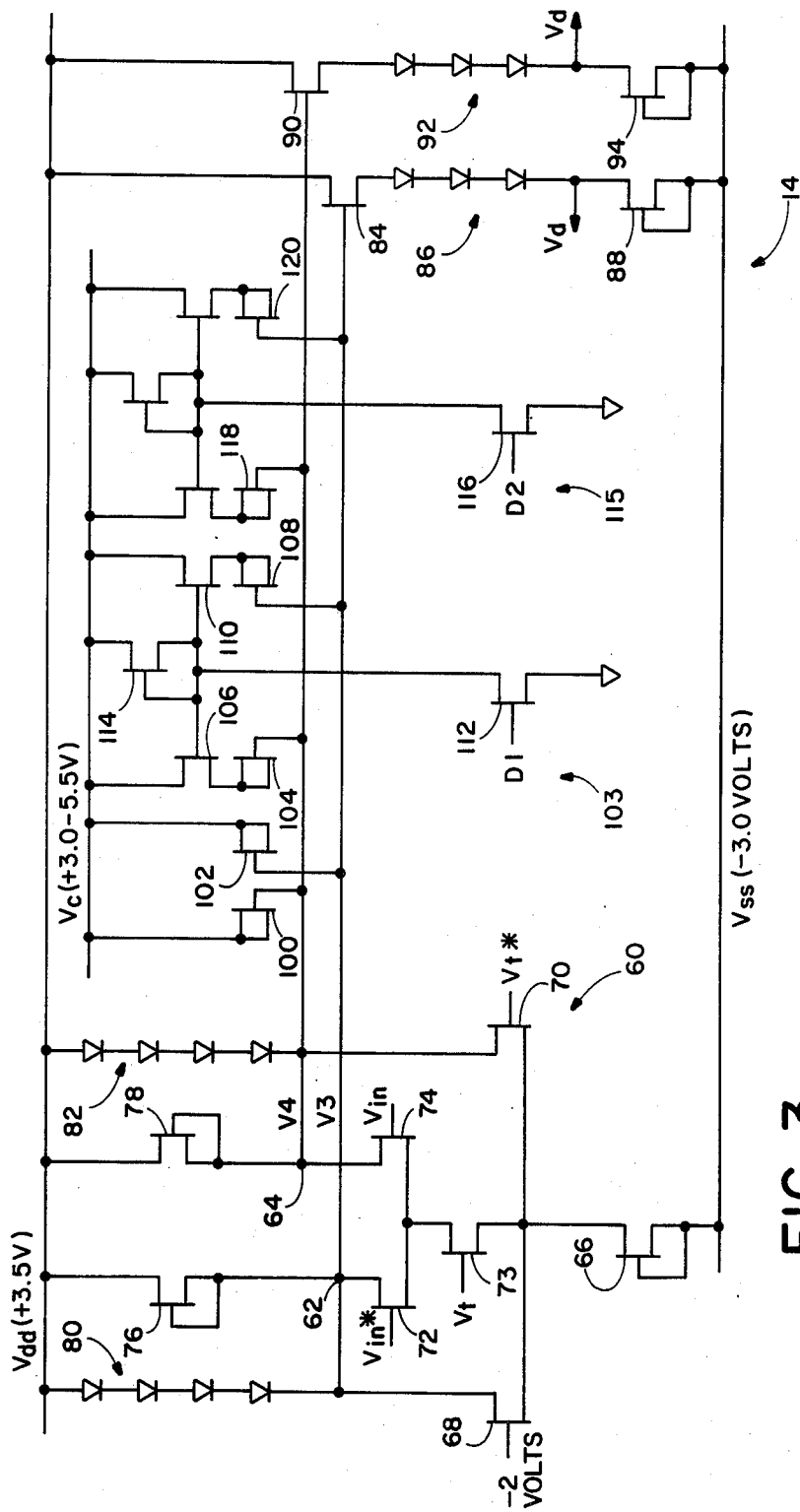
FIG. 3 is a schematic diagram of the triggerable delay circuit of FIG. 1.

FIG. 3 depicts in circuit diagram form a representative one of the triggerable delay circuits 14 of FIG. 1, adapted to produce a differential output signal Vd of a state which tracks the state of a differential input signal Vin after a programmable delay time when the trigger signal Vt is true. When the trigger signal is false, the delay circuit drives the output signal true regardless of the state of the input signal. (With reference to FIG. 1 the NAND gate 12 output signal Vo is the input signal Vin for delay circuit 14a and the feedback signal Vfb is the output signal Vd for delay circuit 14b.) The delay circuit of FIG. 3 includes a current tree 60 for selectively applying a current source either to a circuit node 62 or to a circuit node 64 depending on the states of the trigger signal Vt and the input signal Vin. Current tree 60 includes an FET 66 acting as the current source and a set of five additional FETs 68, 70, 72, 73 and 74. The drains of FETs 68 and 72 are connected to circuit node 62 while the drains of FETs 70 and 74 are connected to circuit node 64. The sources of FETs 72 and 74 are attached to the drain of FET 73 and the sources of FET 68, 70 and 73 are all attached to the drain of FET 66. The gate and source of FET 66 are tied to the −3.0 volt source Vss. The trigger signal Vt controls the gate of FET 73 and the complementary trigger signal Vt* controls the gate of FET 70. The input signal Vin and its complement Vin* drive the gates of FET 74 and 72, respectively. The gate of FET 68 is tied to a −2.0 volt source.

Circuit node 62 is connected to a source of positive voltage Vdd (3.5 volts) through a load impedance provided by FET 76, the gate and source of FET 76 being connected to node 62 and the drain of FET 76 being connected to Vdd. Node 64 is coupled to Vdd through a similar load impedance provided by FET 78. A voltage clamp 80 consisting of a series of four diodes is connected between node 62 and Vdd to limit the voltage drop across FET 76, with a similar voltage clamp 82 being connected between node 64 and Vdd.

The gate of an FET 84 is also attached to node 62. Vdd is applied to the drain of FET 84 and the source of FET 84 is coupled through a set of three diodes 86 to the drain of another FET 88 while the gate and source of FET 88 are tied to Vss. The output signal Vd of the delay circuit is taken at the drain of FET 88 which acts as a current source to draw current through diodes 86 for level shifting downward voltage V3 of node 62 by a voltage drop determined by the gate to source drop of FET 84 in combination with a forward drop across diodes 86. An FET 90, a set of three diodes 92 and an FET 94 operate in a fashion similar to FET 84, diodes 86 and FET 88 to shift downward the voltage V4 of node 64 in order to produce the delay circuit complementary output signal Vd* at the drain of FET 94.

The gate of an FET 100 is connected to circuit node 64 while the drain and source terminals of FET 100 are connected to the control voltage Vc of FIG. 1. Vc is adjustable from 3.0 to 5.5 volts. In this arrangement, FET 100 acts as a variable capacitor, the gate-to-source and gate-to-drain capacitance of the FET 100 coupling Vc to node 64. The magnitude of the capacitance is an inverse function of the voltage difference between Vc and node 64 and therefore can be controlled by varying Vc. An FET 102 is connected in a similar fashion to provide a variable capacitance between Vc and node 62. When delay circuit 14 is in a quiescent, pretrigger state, the trigger signal is false (i.e., Vt is low and Vt* is high) and the input signal Vin is true (i.e., Vin is high and Vin* is low). FETs 68, 72, 73 and 74 are off and FET 70 is on. FET 66 draws a constant current from node 64 through FET 70, the current being supplied to node 64 through FET 78 and clamp 82. The capacitance of FET 100 is fully charged and no current is drawn through FET 100. The voltage V4 of node 64 is approximately 0.7 volts. The complementary output signal Vd* is held in a low logic level state, approximately −1.6 volts. Since FETs 68 and 73 are off, FET 66 draws no current from node 62 and therefore no current is drawn through FET 76 or clamp 80, and the capacitance of FET 102 is fully discharged through FET 76. The voltage V3 at node 62 is equal to Vdd (3.5 volts)

and the delay circuit output signal Vd is at a high logic level state (true). Thus when the delay circuit is in the pretrigger, quiescent state wherein the trigger signal Vt is false, the output signal Vd is true regardless of the state of the input signal Vin.

When the delay circuit is triggered by driving Vt true, gates 73 and 74 turn on and gate 70 turns off. FET 66 now draws current from node 64 through FETs 73 and 74, the current being supplied to node 64 through FET 78 and clamp 82. When the input signal Vin changes to the false state, FET 74 turns off and FET 72 turns on so that the current drawn by FET 66 is supplied from node 62 rather than from node 64. This current supplies charge to the capacitance of FET 102 and as the charge builds up, the voltage V3 at node 62 begins to fall. When the voltage at node V3 falls to about 0.7 volts it is prevented from dropping further by clamping diodes 80. The output voltage Vd of the delay circuit follows the drop in V3 and reaches −1.6 volts when V3 falls to 0.7 volts. At the same time the capacitance of FET 102 is charging, the charge stored by the capacitance of FET 100 is discharged through FET 78, and as the charge in FET 100 is removed, the voltage V4 at node 64 rises. When FET 100 is maximally discharged, V4 rises to 3.5 volts. The complementary output voltage Vd* tracks the rise in V4 and therefore increases from −1.6 to about 0.7 volts.

Thus when Vin switches from true to false, Vd switches from true to false, but with a delay determined by the capacitance of FETs 100 and 102 in combination with the impedance of FETs 76 and 78. The delay may be increased by increasing the capacitance of FETs 100 and 102 and the capacitance of these FETs may be increased by decreasing the magnitude of Vc. Conversely, the delay provided by the delay circuit may be decreased by increasing Vc. The control voltage of Vc is therefore used to finely adjust the delay of the delay circuit by finely adjusting the capacitance of FETs 100 and 102.

The delay provided by the delay circuit 14 may be shifted to a higher range by switching additional capacitance in parallel with FETs 100 and 102. A capacitance bank 103 includes an FET 104 having a gate connected to node 64 and drain and source terminals connected to Vc through the source to drain path of another FET 106. The gate of FET 106 is attached to the gate and source of an FET 114 and to the drain of another FET 112. Vc is supplied to the drain of FET 114 while the source of FET 112 is grounded. The D1 control signal of FIG. 1 is applied to the gate of FET 112. Capacitance bank 103 also includes an FET 108 having a gate connected to node 62 and drain and source terminals tied to the source of an FET 110. The control voltage Vc is applied to the drain of FET 110 and the gate of FET 110 is connected to the drain of FET 112.

When the control signal D1 is low, FET 112 is off and the gates of FETs 106 and 110 are pulled up by Vc acting through FET 114, thereby turning on FETs 106 and 110 such that FETs 104 and 108 are connected in parallel to FETs 100 and 102 respectively. This increases the capacitance across load FETs 76 and 78 and therefore increases the delay of the delay circuit 114 over that resulting from connecting only FETs 100 and 102 across FETs 76 and 78. When the control signal D1 is asserted, FET 112 turns on and pulls the gates of FETs 106 and 110 low, turning FETs 106 and 110 off, and thereby uncoupling FETs 104 and 108 from Vc. The delay circuit also includes another capacitance bank 115 similar to bank 103 for selectively connecting a pair of FETs 118 and 120 between Vc and node 62 and 64, the FETs 118 and 120 providing additional capacitance in parallel with FETs 100 and 102, respectively, to further increase the delay of the delay circuit. The switching of bank 115 is controlled by control signal D2 of FIG. 1, signal D2 being applied to the gate of an FET 116 of bank 115 which functions in a similar fashion to FET 112 of bank 103. Thus, the control signals D1 and D2 are utilized to adjust the number of capacitance elements connected in parallel between Vc and circuit nodes 62 and 64 for grossly adjusting the time delay of the delay circuit. The control voltage Vc provides a means for finely adjusting the value of all capacitance elements connected between Vc and node 62 and 64 to finely adjust the time delay of the circuit.

Thus when the triggerable delay circuit of FIG. 3 is triggered, it provides an output signal of a state which tracks the state of an input signal with an adjustable delay period. When the trigger signal is deasserted, the delay circuit output signal is forced to a steady state. The use of this triggerable delay circuit in the triggered oscillator 10 of FIG. 1, substantially reduces the relaxation time required before the oscillator may be retriggered. As previously mentioned, the relaxation time of a prior art oscillator utilizing a NAND gate and a non-triggerable delay circuit to provide negative feedback to the NAND gate is equal to the sum of the propagation time of the NAND gate and the delay time of the delay circuit. When a triggerable delay circuit is utilized to provide the feedback signal to the NAND gate, the relaxation time is equal to the larger of the NAND gate propagation time and the maximum "reset" time required for the triggerable delay circuit to return to its steady state, pretrigger condition following deassertion of the trigger signal. For the triggerable delay circuit of FIG. 3, the maximum reset time is equal to the delay time of the delay circuit. When several triggerable delay circuits are connected in series as shown in FIG. 1, with each delay circuit providing an equal portion of the total required feedback delay, the relaxation time of the oscillator is equal to the larger of the propagation time of the NAND gate and the delay time (reset time) of just one of the delay circuits. Thus, assuming that the propagation time of the NAND gate is negligibly small, when a single triggerable delay circuit is replaced by N series connected triggerable delay circuits providing the same overall feedback delay, the relaxation time for the oscillator is further reduced by a factor of N.

While a preferred embodiment of the present invention has been shown and described it will be apparent to those skilled in the art that many changes and modifications may be made without departing from the invention in its broader aspects. The appended claims are therefore intended to cover all such changes and modifications as fall within the true spirit and scope of the invention.

I claim:

1. A triggered oscillator comprising:
   logic gate means for generating an oscillator output signal of state set according to the state of a feedback signal; and
   feedback means for generating said feedback signal of state set in delayed response to the states of said oscillator output signal and a trigger signal, wherein said logic gate means comprises a differential logic gate and wherein said trigger signal, said feedback signal, and said oscillator output signal are all differential signals.

2. The triggered oscillator according to claim 1 wherein said feedback means sets the state of said feedback signal in delayed response to the state of said oscillator output signal when said trigger signal is of a first state, and sets said feedback signal to a constant state when said trigger signal is of a second state.

3. A triggered oscillator comprising:

logic gate means for generating an oscillator output signal of state set according to the states of a trigger signal and a feedback signal; and a plurality of triggerable delay circuits each producing an output signal of state set in delayed response to the state of an input signal when triggered by said trigger signal, said triggerable delay circuits being connected in a series, said oscillator output signal being applied as an input signal to a first triggerable delay circuit of said series, an output signal of a last triggerable delay circuit of said series providing said feedback signal, such that said series of triggerable delay circuits sets the state of said feedback signal in delayed response to the state of said oscillator output signal when each said triggerable delay circuit is triggered by said trigger signal, wherein said logic gate means comprises a differential logic gate and wherein said trigger signal, said feedback signal, and said oscillator output signal are all differential signals.

4. The triggered oscillator according to claim 3 wherein at least one of said plurality of triggerable delay circuits sets its output signal to a constant state when not triggered by said trigger signal.

5. A triggered, voltage controlled oscillator comprising:

a logic gate responsive to an input trigger signal and a feedback signal, said logic gate producing an output signal of a constant state when said trigger signal is of a first state, and producing said output signal of state determined by the state of said feedback signal when said trigger signal is of a second state; and a triggerable delay circuit responsive to said output signal for generating said feedback signal of a constant state when said trigger signal is of said first state and for generating said feedback signal of a state set in delayed response to the state of said output signal when said trigger signal is of said second state, wherein said logic gate is a differential logic gate and wherein said trigger signal, said feedback signal, and said gate output signal are all differential signals.

6. A triggered, voltage controlled oscillator comprising:

a logic gate responsive to an input trigger signal and a feedback signal, said logic gate producing an output signal of a constant state when said trigger signal is of a first state, and producing said output signal of state determined by the state of said feedback signal when said trigger signal is of a second state; and a triggerable delay circuit responsive to said output signal for generating said feedback signal of a constant state when said trigger signal is of said first state and for generating said feedback signal of a state set in delayed response to the state of said output signal when said trigger signal is of said second state, said triggerable delay circuit comprising a first circuit node, a second circuit node, a current source, a first voltage source resistively coupled to said first circuit node, and resistively coupled to said second circuit node, a second voltage source for producing a voltage of variable magnitude, a first capacitance element capacitively coupling said second voltage source to said first circuit node, the capacitance of said first capacitance element varying according to the voltage across said first capacitance element, a second capacitance element capacitively coupling said second voltage source to said second circuit node, the capacitance of said second capacitance element varying according to the voltage across said second capacitance element, and first switch means responsive to said logic gate output signal for selectively connecting said current source to either one of said first and second circuit nodes according to the state of said logic gate output signal.

7. The oscillator according to claim 6 further comprising means for level shifting signals appearing at said first and second circuit nodes to produce said feedback signal.

8. A triggered, voltage controlled oscillator comprising:

a logic gate responsive to an input trigger signal and a feedback signal, said logic gate producing an output signal of a constant state when said trigger signal is of a first state, and producing said output signal of state determined by the state of said feedback signal when said trigger signal is of a second state;

a triggerable delay circuit responsive to said output signal for generating said feedback signal of a constant state when said trigger signal is of said first state and for generating said feedback signal of a state set in delayed response to the state of said output signal when said trigger signal is of said second state, wherein said triggerable delay circuit comprises a first circuit node, a second circuit node, a current source, a first voltage source resistively coupled to said first circuit node and resistively coupled to said second circuit node, a second voltage source for producing a voltage of adjustable magnitude, a first capacitance element of capacitance varying according to the voltage across said first capacitance element, a second capacitance element of capacitance varying according to the voltage across said second capacitance element, means responsive to a control signal for selectively coupling said second voltage source to said first circiut node through said first capacitance element and to said second circuit node through said second capacitance element, and means responsive to said logic gate output signal and to said trigger signal for selectively connecting said current source to one of said first and second circuit nodes according to the state of said logic gate output signal when said trigger signal is of said second state, and for connecting said current source to said second circuit node when said trigger signal is of said first state.

9. The oscillator according to claim 8 wherein said first and second capacitance elements comprise field effect transistors.

10. A triggered, voltage controlled oscillator comprising:

a logic gate connected to receive an input trigger signal and an input feedback signal, said logic gate producing an output signal of a constant state when said trigger signal is of a first state and producing said output signal of state determined by the state of the feedback signal when the trigger signal is of a second state;

a first circuit node;

a second circuit node;

a current source;

a first voltage source resistively coupled to said first circuit node and to said second circuit node;

a second voltage source for producing a voltage of adjustable magnitude;

a first capacitance element of capacitance varying according to the voltage across said first capacitance element;

a second capacitance element of capacitance varying according to the voltage across said second capacitance element;

means responsive to a control signal for selectively coupling said second voltage source to said first circuit node through said first capacitance element and to said second circuit node through said second capacitance element;

means responsive to said logic gate output signal and to said trigger signal for selectively connecting said current source to one of said first and second circuit nodes according to the state of said logic gate output signal when said trigger signal is of said second state, and for connecting said current source to said second circuit node when said trigger signal is of said first state; and means for producing said feedback signal of state responsive to the state of a voltage across said first and second circuit nodes.

* * * * *